United States Patent
Lee

(10) Patent No.: US 12,349,542 B2
(45) Date of Patent: Jul. 1, 2025

(54) PIXEL AND DISPLAY DEVICE INCLUDING THE SAME

(71) Applicant: Samsung Display Co., LTD., Yongin-si (KR)

(72) Inventor: Gichang Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 548 days.

(21) Appl. No.: 17/864,024

(22) Filed: Jul. 13, 2022

(65) Prior Publication Data
US 2023/0109361 A1 Apr. 6, 2023

(30) Foreign Application Priority Data
Sep. 23, 2021 (KR) .................... 10-2021-0125783

(51) Int. Cl.
*H10K 59/121* (2023.01)
*G09G 3/3266* (2016.01)
(Continued)

(52) U.S. Cl.
CPC ....... *H10K 59/1213* (2023.02); *G09G 3/3266* (2013.01); *G09G 3/3275* (2013.01);
(Continued)

(58) Field of Classification Search
CPC .......... H10K 59/00–95; G09G 3/3266; G09G 3/3275; G09G 2310/0278; G09G 3/3233;
(Continued)

(56) References Cited

U.S. PATENT DOCUMENTS

| 2019/0221165 A1* | 7/2019 | Park | G09G 3/3291 |
| 2020/0027403 A1* | 1/2020 | Chang | G09G 3/3258 |

(Continued)

FOREIGN PATENT DOCUMENTS

| KR | 10-1700388 | 1/2017 |
| KR | 10-1892510 | 8/2018 |

(Continued)

OTHER PUBLICATIONS

Korean Office Action dated Mar. 3, 2025, in Korean Patent Application No. 10-2021-0125783.

*Primary Examiner* — Bryan R Junge
*Assistant Examiner* — Gary Abel
(74) *Attorney, Agent, or Firm* — KILE PARK REED & HOUTTEMAN PLLC

(57) ABSTRACT

A pixel may include a light emitting element; a first transistor electrically connected between a first node and a second node, the first transistor controlling a driving current provided to the light emitting element based on a voltage of a third node; a second transistor electrically connected between a data line providing a data signal and the first node, the second transistor being turned-on in response to a write gate signal; a third transistor electrically connected between the second node and the third node, the third transistor being turned-on in response to a compensation gate signal; and a bias transistor electrically connected between an emission control line providing an emission control signal and the first node, the bias transistor including a gate electrode electrically connected to the first node.

20 Claims, 8 Drawing Sheets

(51) Int. Cl.
*G09G 3/3275* (2016.01)
*H10K 59/131* (2023.01)

(52) U.S. Cl.
CPC ....... *H10K 59/1216* (2023.02); *H10K 59/131* (2023.02); *G09G 2310/0278* (2013.01)

(58) Field of Classification Search
CPC ... G09G 2300/0819; G09G 2300/0842; G09G 2300/0861; G09G 2310/0251; G09G 2310/0262; G09G 2320/0247; G09G 2320/045; G09G 2340/0435; H10D 86/021–0251; H10D 86/40–60; H10H 29/012; H10H 29/30–49
See application file for complete search history.

(56) References Cited

U.S. PATENT DOCUMENTS

| | | | |
|---|---|---|---|
| 2020/0211459 A1 | 7/2020 | Hyun | |
| 2021/0027696 A1 | 1/2021 | Kim et al. | |

FOREIGN PATENT DOCUMENTS

| | | |
|---|---|---|
| KR | 10-2020-0083803 | 7/2020 |
| KR | 10-2021-0013509 | 2/2021 |

* cited by examiner

PIXEL AND DISPLAY DEVICE INCLUDING THE SAME

CROSS-REFERENCE TO RELATED APPLICATION(S)

This application claims priority to and benefits of Korean Patent Application No. 10-2021-0125783 under 35 USC § 119, filed in the Korean Intellectual Property Office (KIPO) on Sep. 23, 2021, the entire contents of which are incorporated herein by reference.

BACKGROUND

1. Technical Field

Embodiments relate to a pixel capable of applying a bias voltage to a driving transistor without an additional line, and a display device driven by various frequencies and improving display quality.

2. Description of the Related Art

A display device may include pixels. Each of the pixels may include a light emitting element, transistors, and at least one capacitor. The transistors and the capacitor may generate a driving current. The light emitting element may emit light based on the driving current.

The variety of frequencies for driving a display device has been increased. It is desired that the display device has improved driving efficiency and reduced power consumption. The display device is used at a low frequency for this purpose. However, in case that the display device is driven at the low frequency, flicker may occur in the display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a pixel in which a bias voltage is applied to a driving transistor without an addition of a line or an additional line.

Embodiments also provide a display device driven by various frequencies and improving display quality.

A pixel according to an embodiment may include a light emitting element; a first transistor electrically connected between a first node and a second node, the first transistor controlling a driving current provided to the light emitting element based on a voltage of a third node; a second transistor electrically connected between a data line providing a data signal and the first node, the second transistor being turned-on in response to a write gate signal; a third transistor electrically connected between the second node and the third node, the third transistor being turned-on in response to a compensation gate signal; and a bias transistor electrically connected between an emission control line providing an emission control signal and the first node, the bias transistor including a gate electrode electrically connected to the first node.

In an embodiment, the bias transistor may apply the emission control signal to the first node in response to the emission control signal.

In an embodiment, the third transistor may be turned-on at a first frequency, and the bias transistor may be turned-on at a second frequency greater than the first frequency.

In an embodiment, the first frequency may be equal to an image refresh rate, and may correspond to a divisor of the second frequency.

In an embodiment, the pixel may further include a fourth transistor electrically connected between a first initialization power source and the third node, the fourth transistor being turned-on in response to an initialization gate signal; a fifth transistor electrically connected between a first power source and the first node, the fifth transistor being turned-off in response to the emission control signal; a sixth transistor electrically connected between the second node and a first electrode of the light emitting element, the sixth transistor being turned-off in response to the emission control signal; a seventh transistor electrically connected between a second initialization power source and the first electrode of the light emitting element, the seventh transistor being turned-on in response to a bypass gate signal; and a storage capacitor electrically connected between the third node and the first power source.

In an embodiment, the fourth transistor may be turned-on at the first frequency, and the fifth transistor and the sixth transistor may be turned-off at the second frequency.

In an embodiment, each of the first, second, and bias transistors may be a P-type transistor, and the third transistor may be an N-type oxide semiconductor transistor.

A pixel according to an embodiment may include a light emitting element; a first transistor electrically connected between a first node and a second node, the first transistor controlling a driving current provided to the light emitting element based on a voltage of a third node; a second transistor electrically connected between a data line providing a data signal and the first node, the second transistor being turned-on in response to a write gate signal; a third transistor electrically connected between the second node and the third node, the third transistor being turned-on in response to a compensation gate signal; a first bias transistor electrically connected between a fourth node and the first node, the first bias transistor including a gate electrode electrically connected to the first node; and a second bias transistor electrically connected between an emission control line providing an emission control signal and the fourth node, the second bias transistor being turned-off in response to the compensation gate signal.

In an embodiment, the first bias transistor and the second bias transistor may apply the emission control signal to the first node in response to the emission control signal and the compensation gate signal.

In an embodiment, a period in which the first bias transistor and the second bias transistor are turned-on may not overlap a period in which the second transistor is turned-on.

In an embodiment, the pixel may further include a fourth transistor electrically connected between a first initialization power source and the third node, the fourth transistor being turned-on in response to an initialization gate signal; a fifth transistor electrically connected between a first power source and the first node, the fifth transistor being turned-off in response to the emission control signal; a sixth transistor electrically connected between the second node and a first electrode of the light emitting element, the sixth transistor being turned-off in response to the emission control signal;

a seventh transistor electrically connected between a second initialization power source and the first electrode of the light emitting element, the seventh transistor being turned-on in response to a bypass gate signal; and a storage capacitor electrically connected between the third node and the first power source.

In an embodiment, the third transistor and the fourth transistor may be turned-on at a first frequency, and the fifth transistor and the sixth transistor may be turned-off at a second frequency greater than the first frequency.

In an embodiment, the first frequency may be equal to an image refresh rate, and may correspond to a divisor of the second frequency.

In an embodiment, each of the first, second, first bias, and second bias transistors may be a P-type transistor, and the third transistor may be an N-type oxide semiconductor transistor.

A display device according to an embodiment may include a pixel; a gate driver that provides a compensation gate signal at a first frequency and a write gate signal to the pixel; an emission driver that provides an emission control signal at a second frequency greater than the first frequency to the pixel; and a data driver that provides a data signal to the pixel based on the first frequency. The pixel may include a light emitting element; a first transistor electrically connected between a first node and a second node, the first transistor controlling a driving current provided to the light emitting element based on a voltage of a third node; a second transistor electrically connected between a data line providing the data signal and the first node, the second transistor being turned-on in response to the write gate signal; a third transistor electrically connected between the second node and the third node, the third transistor being turned-on in response to the compensation gate signal; and a bias transistor electrically connected between an emission control line providing the emission control signal and the first node, the bias transistor including a gate electrode electrically connected to the first node.

In an embodiment, the gate driver may provide the compensation gate signal in a display scan period within a frame period and not provide the compensation gate signal in a self-scan period within the frame period, and the emission driver may provide the emission control signal in the display scan period and the self-scan period.

In an embodiment, the gate driver may further provide an initialization gate signal at the first frequency and a bypass gate signal to the pixel, and the pixel may further include a fourth transistor electrically connected between a first initialization power source and the third node, the fourth transistor being turned-on in response to the initialization gate signal; a fifth transistor electrically connected between a first power source and the first node, the fifth transistor being turned-off in response to the emission control signal; a sixth transistor electrically connected between the second node and a first electrode of the light emitting element, the sixth transistor being turned-off in response to the emission control signal; a seventh transistor electrically connected between a second initialization power source and the first electrode of the light emitting element, the seventh transistor being turned-on in response to the bypass gate signal; and a storage capacitor electrically connected between the third node and the first power source.

In an embodiment, the gate driver may provide the initialization gate signal in the display scan period and not to provide the initialization gate signal in the self-scan period.

In an embodiment, the first frequency may be equal to an image refresh rate, and may correspond to a divisor of the second frequency.

In an embodiment, a number of the self-scan period included in the frame period may increase in case that the first frequency decreases.

The pixel according to the embodiments may include the diode-connected bias transistor applying the emission control signal as a bias voltage to the first transistor that is a driving transistor. Thus, the hysteresis of the first transistor may be compensated without the addition of the line. Accordingly, a density of the pixels or an area of the pixel may not increase.

The display device according to the embodiments may include the pixel, and the display device may be driven at the various frequencies. Thus, the flicker of the display device may be improved (e.g., decreased or prevented).

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
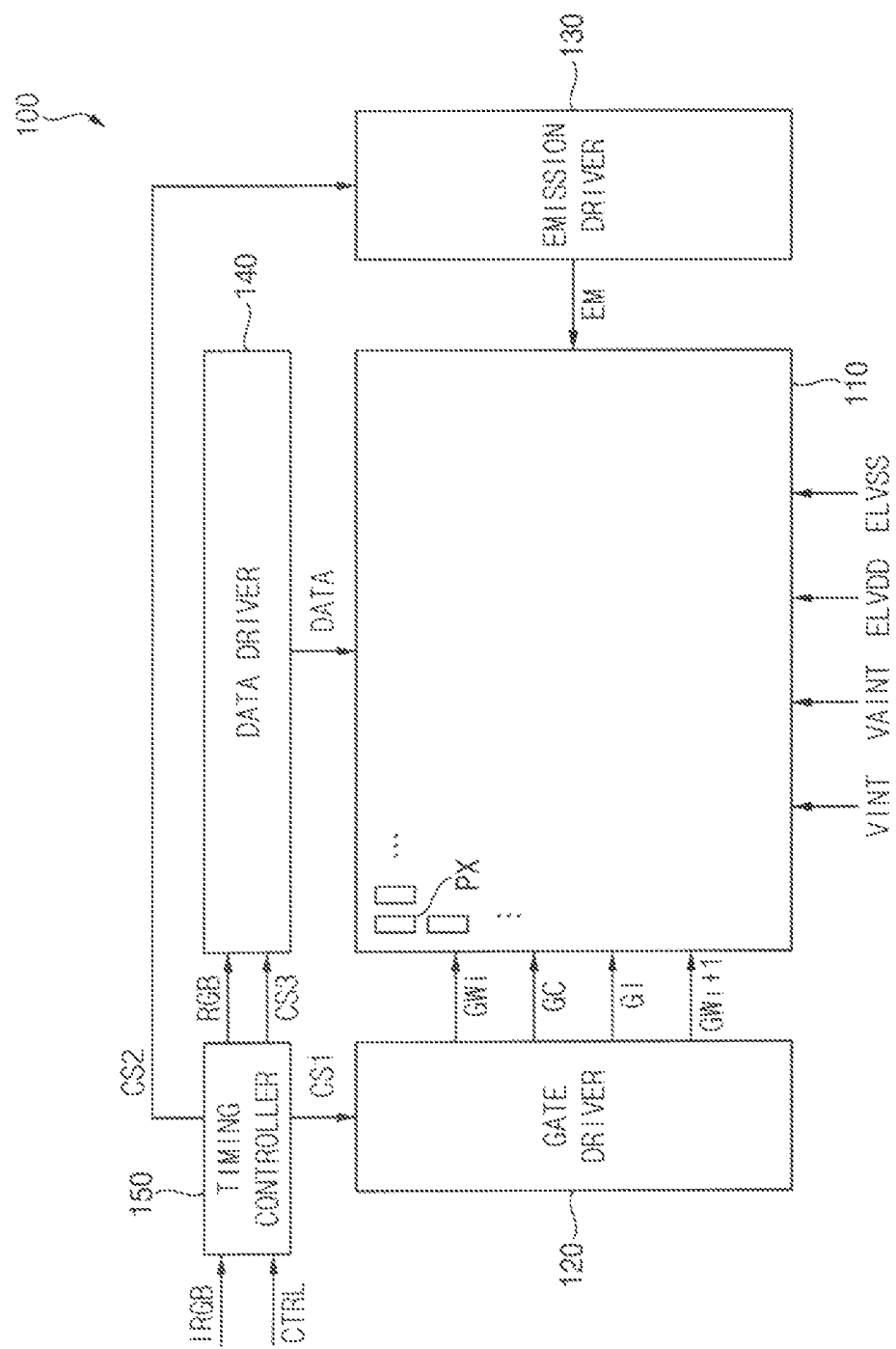
FIG. 1 is a schematic block diagram illustrating a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified or implied herein, the illustrated embodiments are to be understood as providing exemplary features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic block diagram illustrating a display device 100 according to an embodiment.

Referring to FIG. 1, the display device 100 may include a display panel 110, a gate driver 120, an emission driver 130, a data driver 140, and a timing controller 150.

The display panel 110 may include pixels PX. The display panel 110 may receive gate signals GWi, GC, GI, and GWi+1 from the gate driver 120. The display panel 110 may receive an emission control signal EM from the emission driver 130, and may receive a data signal DATA from the data driver 140. Each of the pixels PX may emit light based on the gate signals GWi, GC, GI, and GWi+1, the emission control signal EM, and the data signal DATA.

Each of the pixels PX may include a light emitting element. In an embodiment, each of the pixels PX may include an organic light emitting diode (OLED), and the display panel 110 may be an organic light emitting display panel. In another embodiment, each of the pixels PX may include an inorganic light emitting diode, a quantum dot light emitting diode, or the like.

The display device 100 may display an image using a variable refresh rate (VRR) method capable of changing an image refresh rate. The image refresh rate may indicate the number of images displayed from the display device 100 for 1 second.

The display device 100 may control an output frequency of the gate driver 120 and an output frequency of the data driver 140 according to driving conditions. In an embodiment, the display device 100 may display an image at various image refresh rates ranging from about 1 Hz to about 120 Hz. In another embodiment, the display device 100 may display an image at an image refresh rate greater than about 120 Hz (e.g., about 240 Hz or about 480 Hz).

The gate driver 120 may receive a first control signal CS1 from the timing controller 150. The gate driver 120 may generate the gate signals GWi, GC, GI, and GWi+1 based on the first control signal CS1. The gate driver 120 may provide the gate signals GWi, GC, GI, and GWi+1 to the pixel PX.

The gate signals GWi, GC, GI, and GWi+1 may include a write gate signal GWi, a compensation gate signal GC, an initialization gate signal GI, and a bypass gate signal GWi+1. In an embodiment, the bypass gate signal GWi+1 may be a signal in which the write gate signal GWi is shifted (delayed) by a horizontal period. For example, the bypass gate signal GWi+1 applied to the pixel PX disposed in an N-th pixel row may be a write gate signal applied to the pixel PX disposed in an (N+1)-th pixel row.

In an embodiment, the gate driver 120 may provide the compensation gate signal GC and the initialization gate signal GI at a first frequency, and may provide the write gate signal GWi and the bypass gate signal GWi+1 at a second frequency greater than the first frequency. In another embodiment, the gate driver 120 may provide the write gate signal GWi, the compensation gate signal GC, the initialization gate signal GI, and the bypass gate signal GWi+1 at the first frequency. Hereinafter, it is described that the gate driver 120 provides the compensation gate signal GC and the initialization gate signal GI at the first frequency, and provides the write gate signal GWi and the bypass gate signal GWi+1 at the second frequency.

The first frequency may be identical to the image refresh rate of the display device 100, and may correspond to a divisor of the second frequency. In an embodiment, the second frequency may be about twice the maximum image refresh rate of the display device 100. For example, in case that the maximum image refresh rate of the display device 100 is about 120 Hz, the second frequency may be about 240 Hz.

The emission driver 130 may receive a second control signal CS2 from the timing controller 150. The emission driver 130 may generate the emission control signal EM based on the second control signal CS2. The emission driver 130 may provide the emission control signal EM to the pixel PX. The emission driver 130 may provide the emission control signal EM at the second frequency.

The data driver 140 may receive a third control signal CS3 and image data RGB from the timing controller 150. The data driver 140 may generate the data signal DATA based on the third control signal CS3 and the image data RGB. The data driver 140 may provide the data signal DATA to the pixel PX. The data driver 140 may provide the data signal DATA based on the first frequency.

The timing controller 150 may receive input image data IRGB and a control signal CTRL from an external host processor (e.g., a graphic processing part (GPU) or graphic card). The timing controller 150 may generate the first control signal CS1, the second control signal CS2, the third control signal CS3, and the image data RGB based on the input image data IRGB and the control signal CTRL.

Power sources may provide voltages to the display panel 110. The power sources may include a first initialization power source VINT, a second initialization power source VAINT, a first power source ELVDD, and a second power source ELVSS.

Figure 2:
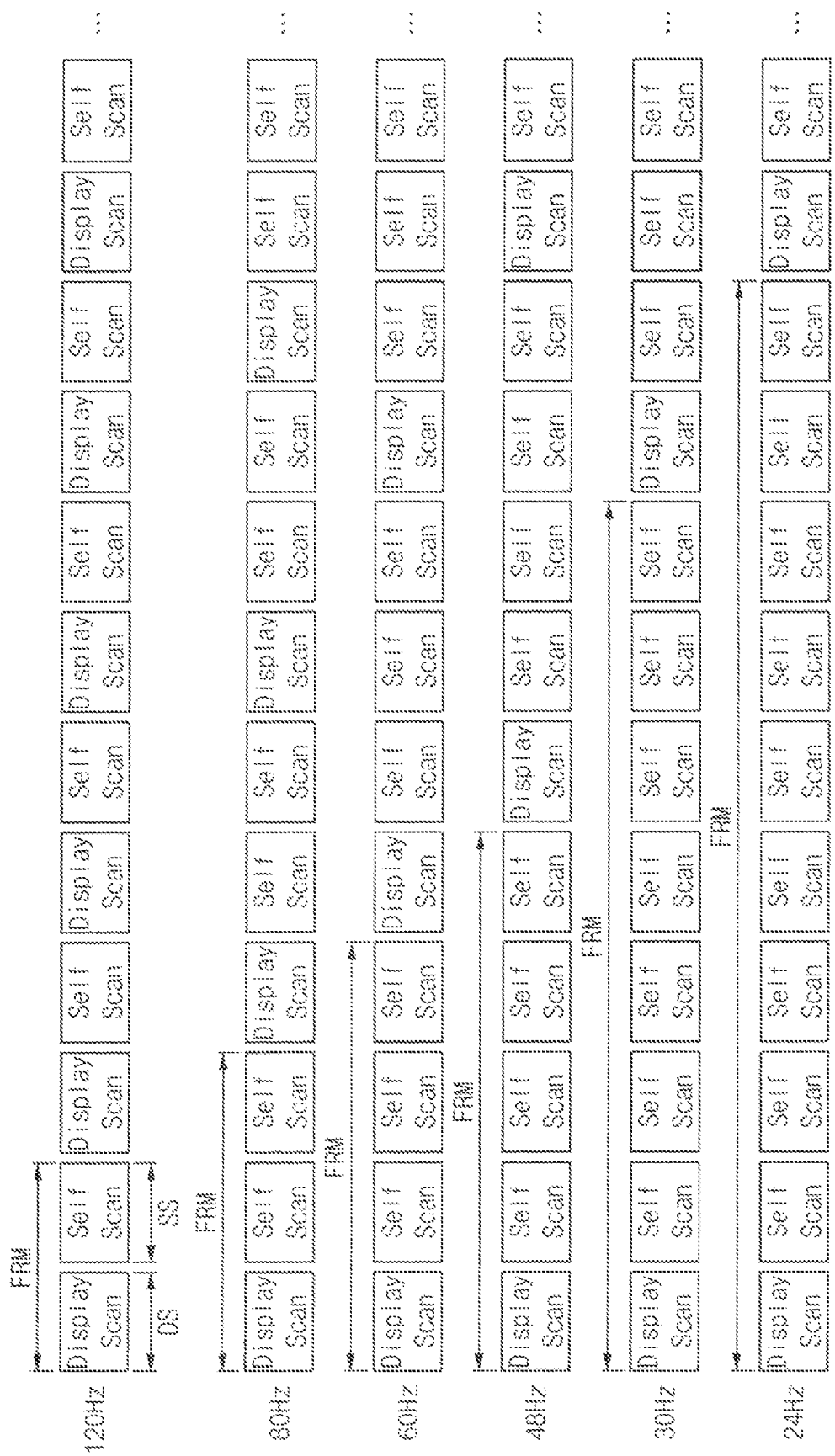
FIG. 2 is a schematic diagram for describing a method of driving the display device in FIG. 1.

FIG. 2 is a schematic diagram for describing a method of driving the display device 100 in FIG. 1.

Referring to FIGS. 1 and 2, each of frame periods FRM of the display device 100 may include a display scan period DS and at least one self-scan period SS. The pixel PX may store the data signal DATA corresponding to light emitted from the pixel PX during the display scan period DS. A bias voltage may be applied to the pixel PX during the self-scan period SS.

The gate driver 120 may provide the write gate signal GWi and the bypass gate signal GWi+1 in the display scan period DS and the self-scan period SS. The gate driver 120 may provide the compensation gate signal GC and the initialization gate signal GI in the display scan period DS, and may not provide the compensation gate signal GC or the initialization gate signal GI in the self-scan period SS. The emission driver 130 may provide the emission control signal EM in the display scan period DS and the self-scan period SS.

In an embodiment, a length of the display scan period DS and a length of the self-scan period SS may be substantially equal to each other. However, the number of the self-scan periods SS included in the frame period FRM may be determined according to the image refresh rate (e.g., the first frequency). In an embodiment, in case that the image refresh rate (e.g., the first frequency) decreases, the number of the self-scan periods SS included in the frame period FRM may increase.

In case that the display device 100 is driven at an image refresh rate of about 120 Hz, the frame period FRM may include a display scan period DS and a self-scan period SS. The pixel PX may alternately repeat emission and non-emission twice during the frame period FRM. For example, the pixel PX may alternately emit light twice during the frame period FRM.

In case that the display device 100 is driven at an image refresh rate of about 80 Hz, the frame period FRM may include a display scan period DS and two successive self-scan periods SS. The pixel PX may alternately repeat emission and non-emission three times during the frame period FRM. For example, the pixel PX may alternately emit light three times during the frame period FRM.

In case that the display device 100 is driven at an image refresh rate of about 60 Hz, the frame period FRM may include a display scan period DS and three successive self-scan periods SS. The pixel PX may alternately repeat emission and non-emission four times during the frame period FRM. For example, the pixel PX may alternately emit the light four times during the frame period FRM.

In case that the display device 100 is driven at an image refresh rate of about 48 Hz, the frame period FRM may include a display scan period DS and four consecutive self-scan periods SS. The pixel PX may alternately repeat emission and non-emission five times during the frame period FRM. For example, the pixel PX may alternately emit light five times during the frame period FRM.

In case that the display device 100 is driven at an image refresh rate of about 30 Hz, the frame period FRM may include a single display scan period DS and seven successive self-scan periods SS. The pixel PX may alternately repeat emission and non-emission eight times during the frame period FRM. For example, the pixel PX may alternately emit light eight times during the frame period FRM.

In case that the display device 100 is driven at an image refresh rate of about 24 Hz, the frame period FRM may include a single display scan period DS and nine consecutive self-scan periods SS. The pixel PX may alternately repeat emission and non-emission ten times during the frame period FRM. For example, the pixel PX may alternately emit light ten times during the frame period FRM.

In a similar manner to the above, the display device 100 may control the number of the self-scan periods SS included in the frame period FRM, and the display device 100 may be driven at an image refresh rate of about 12 Hz, about 8 Hz, about 6 Hz, about 5 Hz, about 4 Hz, about 3 Hz, about 2 Hz, about 1 Hz, or the like. For example, the display device 100 may be driven at various image refresh rates based on first frequencies corresponding to divisors of the second frequency.

Figure 3:
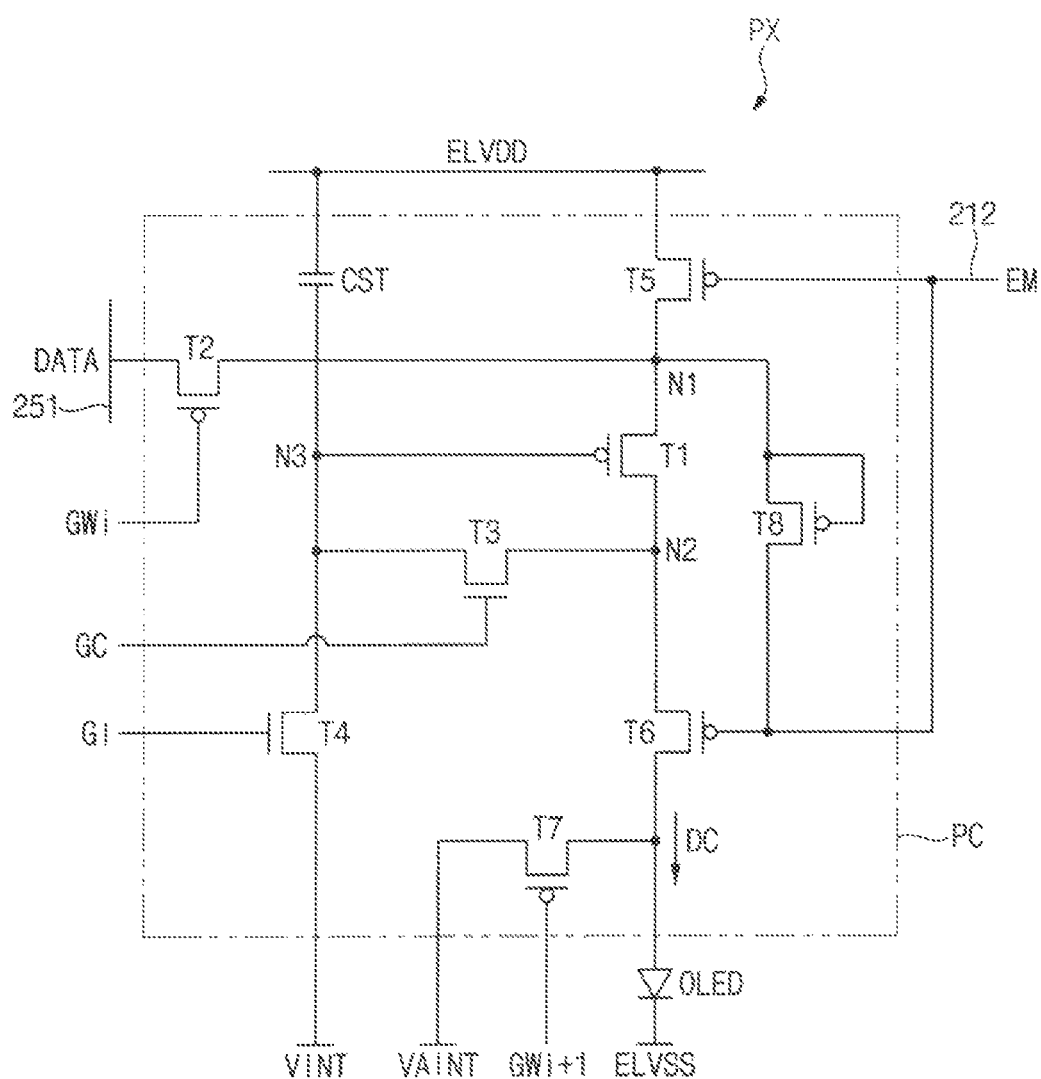
FIG. 3 is a schematic diagram of an equivalent circuit illustrating a pixel according to an embodiment.

FIG. 3 is a schematic diagram of an equivalent circuit illustrating the pixel PX according to an embodiment.

Referring to FIG. 3, the pixel PX may include a light emitting element OLED and a pixel circuit PC.

The light emitting element OLED may be electrically connected between the pixel circuit PC and the second power source ELVSS. A first electrode of the light emitting element OLED may be electrically connected to the pixel circuit PC, and a second electrode of the light emitting element OLED may be electrically connected to the second power source ELVSS. In an embodiment, the first electrode and the second electrode of the light emitting element OLED may be an anode electrode and a cathode electrode, respectively. The light emitting element OLED may emit light based on a driving current DC provided from the pixel circuit PC.

The pixel circuit PC may include transistors and a storage capacitor CST. The transistors may include a first transistor T1, a second transistor T2, a third transistor T3, a fourth transistor T4, a fifth transistor T5, a sixth transistor T6, a seventh transistor T7, and a bias transistor T8.

The first transistor T1 may be electrically connected between a first node N1 and a second node N2, and may control the driving current DC provided to the light emitting element OLED based on a voltage of a third node N3. A first electrode of the first transistor T1 may be electrically connected to the first node N1. A second electrode of the first transistor T1 may be electrically connected to the second node N2. A gate electrode of the first transistor T1 may be electrically connected to the third node N3.

The first transistor T1 may control the amount of the driving current DC flowing from the first power source ELVDD to the second power source ELVSS via the light emitting element OLED. A voltage of the first power source ELVDD may be greater than a voltage of the second power source ELVSS.

The second transistor T2 may be electrically connected between a data line 251 providing the data signal DATA and the first node N1, and may be turned-on in response to the write gate signal GWi. A first electrode of the second transistor T2 may be electrically connected to the data line 251. A second electrode of the second transistor T2 may be electrically connected to the first node N1. A gate electrode of the second transistor T2 may receive the write gate signal GWi.

The second transistor T2 may be turned-on to transmit the data signal DATA to the first node N1, in case that the write gate signal GWi is provided. The second transistor T2 may be turned-on in response to the write gate signal GWi provided at the second frequency, and the second transistor T2 may be turned-on at the second frequency.

The third transistor T3 may be electrically connected between the second node N2 and the third node N3, and may be turned-on in response to the compensation gate signal GC. A first electrode of the third transistor T3 may be electrically connected to the second node N2. A second electrode of the third transistor T3 may be electrically connected to the third node N3. A gate electrode of the third transistor T3 may receive the compensation gate signal GC.

The third transistor T3 may be turned-on to diode-connect the first transistor T1, in case that the compensation gate signal GC is provided. Accordingly, the data signal DATA may be transmitted to the third node N3. A threshold voltage of the first transistor T1 may be compensated for the data signal DATA. The third transistor T3 may be turned-on in response to the compensation gate signal GC provided at the first frequency, and the third transistor T3 may be turned-on at the first frequency.

The fourth transistor T4 may be electrically connected between the first initialization power source VINT and the third node N3, and may be turned-on in response to the initialization gate signal GI. A first electrode of the fourth transistor T4 may be electrically connected to the first initialization power source VINT. A second electrode of the fourth transistor T4 may be electrically connected to the third node N3. A gate electrode of the fourth transistor T4 may receive the initialization gate signal GI.

The fourth transistor T4 may be turned-on to transmit a voltage of the first initialization power VINT to the third node N3 in case that the initialization gate signal GI is provided. The voltage of the first initialization power source VINT may be transmitted to the third node N3, and the gate electrode of the first transistor T1 may be initialized. The fourth transistor T4 may be turned-on in response to the initialization gate signal GI provided at the first frequency, and the fourth transistor T4 may be turned-on at the first frequency.

In an embodiment, the compensation gate signal GC applied to the pixel PX disposed in the N-th pixel row may be substantially equal to the initialization gate signal GI applied to the pixel PX disposed in the (N+1)-th pixel row.

The fifth transistor T5 may be electrically connected between the first power source ELVDD and the first node N1, and may be turned-off in response to the emission control signal EM. A first electrode of the fifth transistor T5 may be electrically connected to the first power source ELVDD. A second electrode of the fifth transistor T5 may be electrically connected to the first node N1. A gate electrode of the fifth transistor T5 may receive the emission control signal EM.

The sixth transistor T6 may be electrically connected between the second node N2 and a first electrode of the light emitting element OLED, and may be turned-off in response to the emission control signal EM. A first electrode of the sixth transistor T6 may be electrically connected to the second node N2. A second electrode of the sixth transistor T6 may be electrically connected to the first electrode of the light emitting element OLED. A gate electrode of the sixth transistor T6 may receive the emission control signal EM.

The fifth transistor T5 and the sixth transistor T6 may be turned-off in response to the emission control signal EM provided at the second frequency, and may be turned-on in case that the supply of the emission control signal EM is stopped. The fifth transistor T5 and the sixth transistor T6 may be turned-off in response to the emission control signal EM provided at the second frequency, and the fifth transistor T5 and the sixth transistor T6 may be turned-off at the second frequency.

The seventh transistor T7 may be electrically connected between the second initialization power source VAINT and the first electrode of the light emitting element OLED, and may be turned-on in response to the bypass gate signal GWi+1. A first electrode of the seventh transistor T7 may be electrically connected to the second initialization power source VAINT. A second electrode of the seventh transistor T7 may be electrically connected to the first electrode of the light emitting element OLED. A gate electrode of the seventh transistor T7 may receive the bypass gate signal GWi+1.

The seventh transistor T7 may be turned-on to transmit a voltage of the second initialization power source VAINT to the first electrode of the light emitting element OLED in case that the bypass gate signal GWi+1 is provided. In case that the voltage of the second initialization power source VAINT is transmitted to the first electrode of the light emitting element OLED, a residual voltage stored in a parasitic capacitor of the light emitting element OLED may be discharged. The residual voltage stored in the parasitic capacitor may be discharged, and unintentional fine light emission of the light emitting element OLED may be prevented. The seventh transistor T7 may be turned-on in response to the bypass gate signal GWi+1 provided at the second frequency, and the seventh transistor T7 may be turned-on at the second frequency.

The bias transistor T8 may be electrically connected between an emission control line 212 providing the emission control signal EM and the first node N1. A first electrode of the bias transistor T8 may be electrically connected to the emission control line 212. A second electrode of the bias transistor T8 may be electrically connected to the first node N1. A gate electrode of the bias transistor T8 may be connected to the second electrode of the bias transistor T8. The gate electrode of the bias transistor T8 may be electrically connected to the second electrode of the bias transistor T8, and the bias transistor T8 may be diode-connected.

The bias transistor T8 may apply the emission control signal EM to the first node N1 in response to the emission control signal EM. For example, the bias transistor T8 may be turned-on to transmit the emission control signal EM to the first node N1 in case that the emission control signal EM is provided. A logic high voltage (e.g., about 10 V) of the emission control signal EM may be greater than a voltage (e.g., about 3 V to about 5 V) of the data signal DATA applied to the first node N1 by the second transistor T2, and accordingly, the bias transistor T8 may be turned-on in case that the logic high voltage of the emission control signal EM is applied through the emission control line 212 to transmit the logic high voltage of the emission control signal EM to the first node N1.

In case that the emission control signal EM is transmitted to the first node N1, the emission control signal EM may be applied as a bias voltage to the first electrode of the first transistor T1, and the first transistor T1 may be on-biased. The first transistor T1 may be on-biased by the emission control signal EM, and hysteresis of the first transistor T1 may be compensated. The bias transistor T8 may be turned-on in response to the emission control signal EM provided at the second frequency, and the bias transistor T8 may be turned-on at the second frequency.

The storage capacitor CST may be electrically connected between the third node N3 and the first power source ELVDD. A first electrode of the storage capacitor CST may be electrically connected to the third node N3, and a second electrode of the storage capacitor CST may be electrically connected to the first power source ELVDD.

In an embodiment, each of the first transistor T1, the second transistor T2, the fifth transistor T5, the sixth transistor T6, the seventh transistor T7, and the bias transistor T8 may be a P-type transistor, and each of the third transistor T3 and the fourth transistor T4 may be an N-type transistor. Accordingly, a gate-on voltage for turning-on the first transistor T1, the second transistor T2, the fifth transistor T5, the sixth transistor T6, the seventh transistor T7, and the bias transistor T8 may be a logic low voltage, and a gate-on voltage for turning-on the third transistor T3 and the fourth transistor T4 may be a logic high voltage.

In an embodiment, each of the first transistor T1, the second transistor T2, the fifth transistor T5, the sixth transistor T6, the seventh transistor T7, and the bias transistor T8 may be polycrystalline silicon transistor, and each of the third transistor T3 and the fourth transistor T4 may be an oxide semiconductor transistor.

In an embodiment, the first electrode of each of the transistors T1, T2, T3, T4, T5, T6, T7, and T8 may be one of a source electrode and a drain electrode, and the second electrode of each of the transistors T1, T2, T3, T4, T5, T6, T7, and T8 may be another of the source electrode and the drain electrode.

Figure 4:
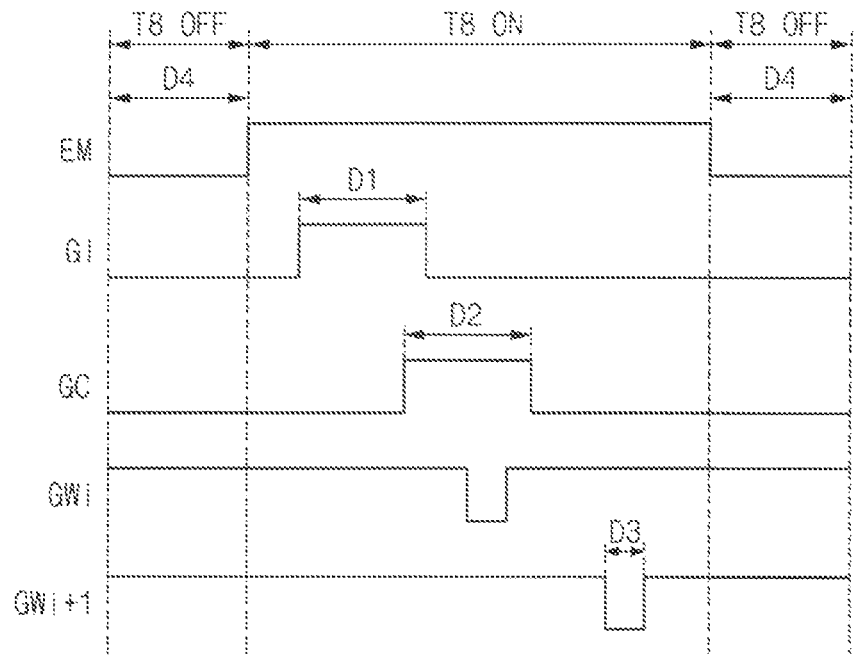
FIGS. 4 and 5 are schematic diagrams for describing a method of driving the pixel in FIG. 3.
Figure 5:
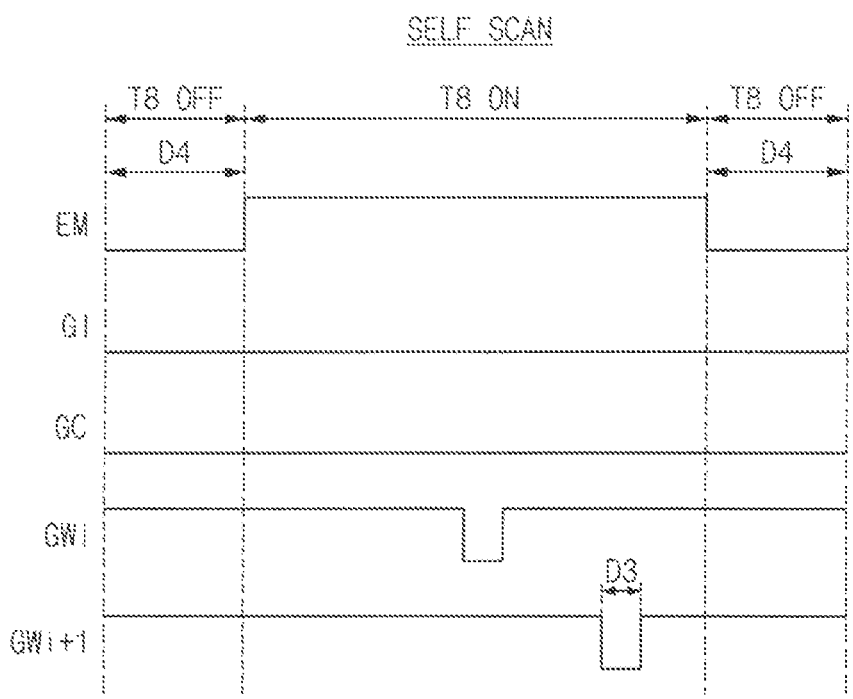

FIGS. 4 and 5 are schematic diagrams for describing a method of driving the pixel PX in FIG. 3.

Referring to FIGS. 3 and 4, the pixel PX may receive signals for displaying an image during the display scan period DS (e.g., refer to FIG. 2).

First, the emission control signal EM may be applied to the pixel PX. In case that the emission control signal EM is applied, the fifth transistor T5 and the sixth transistor T6 may be turned-off, and the bias transistor T8 may be turned-on. In case that the fifth transistor T5 and the sixth transistor T6 are turned-off, the supply of the driving current DC to the light emitting element OLED may be stopped. In case that the bias transistor T8 is turned-on, the logic high voltage of the emission control signal EM may be provided to the first node N1. Accordingly, the logic high voltage of the emission control signal EM, which is a relatively high voltage, may be applied to the first electrode of the first transistor T1, and accordingly, the first transistor T1 may be on-biased while the bias transistor T8 is turned-on.

The initialization gate signal GI may be applied to the pixel PX in an initialization period D1. In case that the initialization gate signal GI is applied, the fourth transistor T4 may be turned-on. In case that the fourth transistor T4 is turned-on, the voltage of the first initialization power source VINT may be applied to the gate electrode of the first transistor T1, and the gate electrode of the first transistor T1 may be initialized.

The compensation gate signal GC, the write gate signal GWi, and the data signal DATA may be applied to the pixel PX in a writing and compensation period D2. In case that the compensation gate signal GC is applied, the third transistor T3 may be turned-on. In case that the write gate signal GWi is applied, the second transistor T2 may be turned-on. In case that the second transistor T2 and the third transistor T3 are turned-on and the data signal DATA is applied, the data signal DATA for which the threshold voltage of the first transistor T1 is compensated may be provided to the gate electrode of the first transistor T1.

The bypass gate signal GWi+1 may be applied to the pixel PX in a bypass period D3. In case that the bypass gate signal GWi+1 is applied, the seventh transistor T7 may be turned-on. In case that the seventh transistor T7 is turned-on, the voltage of the second initialization power source VAINT may be provided to the first electrode of the light emitting element OLED, and the voltage of the parasitic capacitor of the light emitting element OLED may be discharged.

The supply of the emission control signal EM to the pixel PX may be stopped in an emission period D4. In case that the supply of the emission control signal EM is stopped, the fifth transistor T5 and the sixth transistor T6 may be turned-on, and the bias transistor T8 may be turned-off. In case that the fifth transistor T5 and the sixth transistor T6 are turned-on, the driving current DC generated based on the data signal DATA may be provided to the light emitting element OLED, and the light emitting element OLED may emit light with a luminance corresponding to the driving current DC.

The display scan period DS (e.g., refer to FIG. 2) may include the initialization period D1, the writing and compensation period D2, the bypass period D3, and the emission period D4. The initialization period D1, the writing and compensation period D2, and the bypass period D3 may be non-emission periods. In the non-emission periods, the bias transistor T8 may be turned-on, and the logic high voltage of the emission control signal EM may be applied as a bias voltage to the first electrode of the first transistor T1. Accordingly, the first transistor T1 may be on-biased for a sufficient time.

Referring to FIGS. 3 and 5, the pixel PX may receive signals for maintaining the luminance of the image output in the display scan period during the self-scan period.

The driving of the self-scan period may be different from that of the display scan period at least in that the initialization gate signal GI and the compensation gate signal GC are not provided. In the self-scan period, each of the initialization gate signal GI and the compensation gate signal GC may have a logic low voltage. Accordingly, the self-scan period may not include the initialization period D1 or the writing and compensation period D2.

First, the emission control signal EM may be applied to the pixel PX. In case that the emission control signal EM is applied, the fifth transistor T5 and the sixth transistor T6 may be turned-off, and the bias transistor T8 may be turned-on. In case that the fifth transistor T5 and the sixth transistor T6 are turned-off, the supply of the driving current DC to the light emitting element OLED may be stopped. In case that the bias transistor T8 is turned-on, the logic high voltage of the emission control signal EM may be provided to the first node N1. Accordingly, the first transistor T1 may be on-biased while the bias transistor T8 is turned-on.

The bypass gate signal GWi+1 may be applied to the pixel PX in the bypass period D3. In case that the bypass gate signal GWi+1 is applied, the seventh transistor T7 may be turned-on. In case that the seventh transistor T7 is turned-on, the voltage of the second initialization power source VAINT may be provided to the first electrode of the light emitting element OLED, and the voltage of the parasitic capacitor of the light emitting element OLED may be discharged.

The supply of the emission control signal EM to the pixel PX may be stopped in the emission period D4. In case that the supply of the emission control signal EM is stopped, the fifth transistor T5 and the sixth transistor T6 may be turned-on, and the bias transistor T8 may be turned-off. In case that the fifth transistor T5 and the sixth transistor T6 are turned-on, the light emitting element OLED may emit light based on the data signal DATA provided during the display scan period.

In a low frequency driving in which the number of self-scan periods increases, a change in hysteresis of the first transistor T1 may increase, and the increase in the change in the hysteresis of the first transistor T1 may cause flicker of the display device 100. In the embodiment, as the emission control signal EM is provided as a bias voltage to the first electrode of the first transistor T1 during the self-scan period, the hysteresis of the first transistor T1 may be compensated, and the flicker in the low-frequency driving may be improved (e.g., decreased or prevented).

Figure 6:
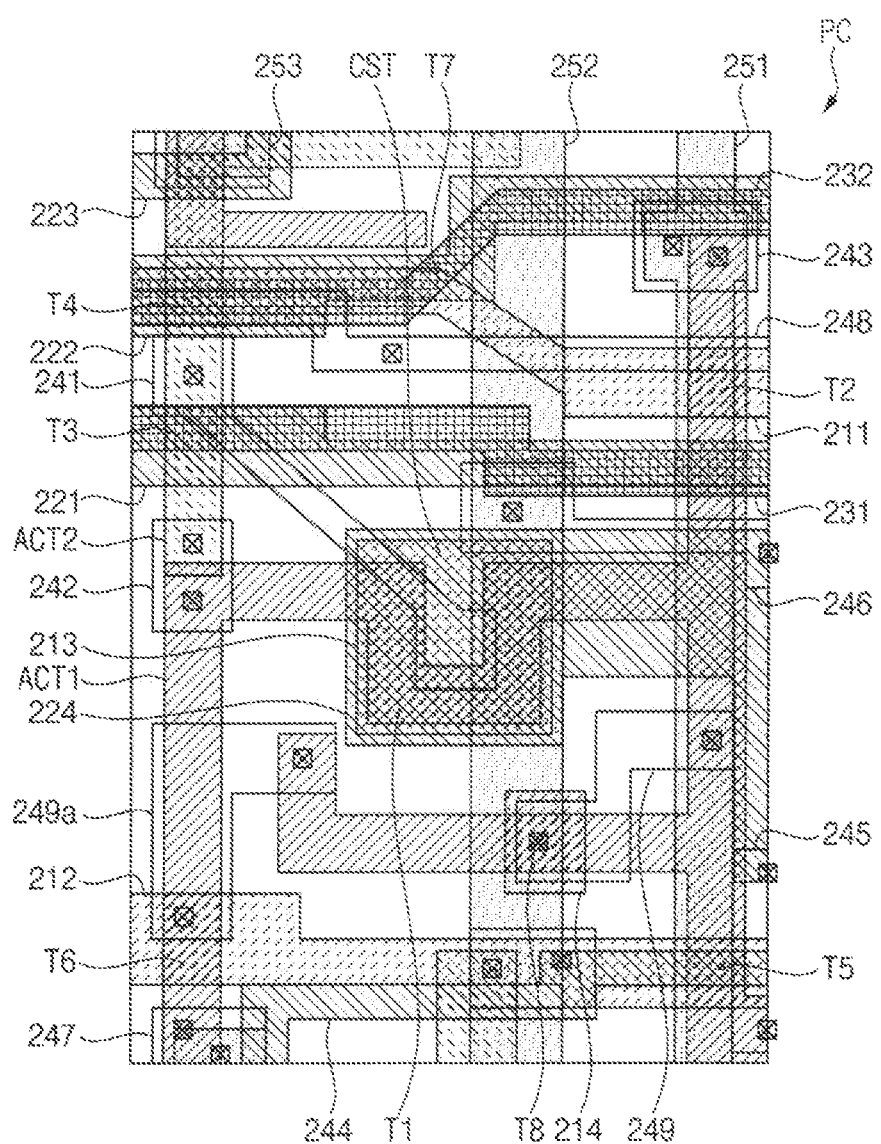
FIG. 6 is a schematic layout diagram illustrating a pixel circuit included in the pixel in FIG. 3.

FIG. 6 is a schematic layout diagram illustrating the pixel circuit PC included in the pixel PX in FIG. 3.

Referring to FIGS. 3 and 6, the pixel circuit PC may include a first active layer ACT1, a first conductive layer, a second conductive layer, a second active layer ACT2, a third conductive layer, a fourth conductive layer, and a fifth conductive layer.

The first active layer ACT1 may be disposed on a substrate. The substrate may include at least one of glass, quartz, metal, polyimide (PI), and the like. In an embodiment, the first active layer ACT1 may include polycrystalline silicon. The first transistor T1, the second transistor T2, the fifth transistor T5, the sixth transistor T6, the seventh transistor T7, and the bias transistor T8 may be formed along the first active layer ACT1.

The first conductive layer may be disposed on the first active layer ACT1. The first conductive layer may include at least one conductive material such as molybdenum (Mo), copper (Cu), aluminum (Al), titanium (Ti), or the like. The first conductive layer may include a write gate line 211, an emission control line 212, a first gate pattern 213, and a second gate pattern 214.

The write gate line 211 may transmit the write gate signal GWi. A first portion of the write gate line 211 overlapping the first active layer ACT1 (e.g., in a plan view), may be the gate electrode of the second transistor T2. In an embodiment, a second portion of the write gate line 211 overlapping the first active layer ACT1 may be the gate electrode of the seventh transistor T7.

The emission control line 212 may transmit the emission control signal EM. A first portion of the emission control line 212 overlapping the first active layer ACT1 may be the gate electrode of the fifth transistor T5. A second portion of the emission control line 212 overlapping the first active layer ACT1 may be the gate electrode of the sixth transistor T6.

A first portion of the first gate pattern 213 overlapping the first active layer ACT1 may be the gate electrode of the first transistor T1, and a second portion of the first gate pattern 213 overlapping a capacitor pattern 224 may be the first electrode of the storage capacitor CST. Description of the capacitor pattern 224 is provided below. A portion of the second gate pattern 214 overlapping the first active layer ACT1 may be the gate electrode of the bias transistor T8.

A first insulating layer may be disposed between the first active layer ACT1 and the first conductive layer. The first insulating layer may include at least one inorganic insulating material such as silicon oxide, silicon nitride, silicon oxynitride, or the like.

The second conductive layer may be disposed on the first conductive layer. The second conductive layer may include at least one conductive material such as molybdenum (Mo), copper (Cu), aluminum (Al), titanium (Ti), or the like. The second conductive layer may include a first compensation gate line 221, a first initialization gate line 222, a first initialization voltage line 223, and a capacitor pattern 224.

The first compensation gate line 221 may transmit the compensation gate signal GC. A portion of the first compensation gate line 221 overlapping the second active layer ACT2 may be the gate electrode of the third transistor T3.

The first initialization gate line 222 may transmit the initialization gate signal GI. A portion of the first initialization gate line 222 overlapping the second active layer ACT2 may be the gate electrode of the fourth transistor T4.

The first initialization voltage line 223 may transmit the voltage of the first initialization power source VINT. A portion of the capacitor pattern 224 overlapping the first gate pattern 213 may be the second electrode of the storage capacitor CST.

A second insulating layer may be disposed between the first conductive layer and the second conductive layer. The second insulating layer may include at least one inorganic insulating material such as silicon oxide, silicon nitride, silicon oxynitride, or the like.

The second active layer ACT2 may be disposed on the second conductive layer. In an embodiment, the second active layer ACT2 may include an oxide semiconductor. The third transistor T3 and the fourth transistor T4 may be formed along the second active layer ACT2.

A third insulating layer may be disposed between the second conductive layer and the second active layer ACT2. The third insulating layer may include at least one inorganic insulating material such as silicon oxide, silicon nitride, silicon oxynitride, or the like.

The third conductive layer may be disposed on the second active layer ACT2. The third conductive layer may include at least one conductive material such as molybdenum (Mo), copper (Cu), aluminum (Al), titanium (Ti), or the like. The third conductive layer may include a second compensation gate line 231 and a second initialization gate line 232.

The second compensation gate line 231 may transmit the compensation gate signal GC. A portion of the second compensation gate line 231 overlapping the second active layer ACT2 may be the gate electrode of the third transistor T3.

The second initialization gate line 232 may transmit the initialization gate signal GI. A portion of the second initialization gate line 232 overlapping the second active layer ACT2 may be the gate electrode of the fourth transistor T4.

A fourth insulating layer may be disposed between the second active layer ACT2 and the third conductive layer. The fourth insulating layer may include at least one inorganic insulating material such as silicon oxide, silicon nitride, silicon oxynitride, or the like.

The fourth conductive layer may be disposed on the third conductive layer. The fourth conductive layer may include at least one conductive material such as molybdenum (Mo), copper (Cu), aluminum (Al), titanium (Ti), or the like. The fourth conductive layer may include a first connection electrode 241, a second connection electrode 242, a third connection electrode 243, a fourth connection electrode 244, a fifth connection electrode 245, a sixth connection electrode 246, a seventh connection electrode 247, a second initialization voltage line 248, an eighth connection electrode 249, and a ninth connection electrode 249a.

The first connection electrode 241 may electrically connect the first gate pattern 213 and the second active layer ACT2. The first connection electrode 241 may electrically connect the gate electrode of the first transistor T1 to the second electrode of the third transistor T3 and the second electrode of the fourth transistor T4.

The second connection electrode 242 may electrically connect the first active layer ACT1 and the second active layer ACT2. The second connection electrode 242 may electrically connect the second electrode of the first transistor T1 and the first electrode of the sixth transistor T6 to the first electrode of the third transistor T3.

The third connection electrode 243 may be electrically connected to the first active layer ACT1. The third connection electrode 243 may be electrically connected to the first electrode of the second transistor T2.

The fourth connection electrode 244 may electrically connect the first initialization voltage line 223 and the second active layer ACT2. The fourth connection electrode 244 may electrically connect the first electrode of the fourth transistor T4 to the first initialization voltage line 223.

The fifth connection electrode 245 may be electrically connected to the first active layer ACT1 and the capacitor electrode 224. The fifth connection electrode 245 may be electrically connected to the first electrode of the fifth transistor T5 and the second electrode of the storage capacitor CST.

The sixth connection electrode 246 may be electrically connected to the capacitor electrode 224. The sixth connection electrode 246 may be electrically connected to the second electrode of the storage capacitor CST.

The seventh connection electrode 247 may be electrically connected to the first active layer ACT1. The seventh connection electrode 247 may be electrically connected to the second electrode of the sixth transistor T6 and the second electrode of the seventh transistor T7.

The second initialization voltage line 248 may transmit the voltage of the second initialization power source VAINT. The second initialization voltage line 248 may be electrically connected to the first active layer ACT1. The second initialization voltage line 248 may be electrically connected to the first electrode of the seventh transistor T7.

The eighth connection electrode 249 may electrically connect the first active layer ACT1 and the second gate pattern 214. The eighth connection electrode 249 may electrically connect the gate electrode of the bias transistor T8 to the second electrode of the bias transistor T8.

The ninth connection electrode 249a may electrically connect the first active layer ACT1 and the emission control line 212. The ninth connection electrode 249a may electrically connect the first electrode of the bias transistor T8 to the emission control line 212.

The bias transistor T8 may be diode-connected by the eighth connection electrode 249, and the first electrode of the bias transistor T8 may be electrically connected to the emission control line 212 by the ninth connection electrode 249a, so that the bias transistor T8 may provide the emission control signal EM transmitted by the emission control line 212 as a bias voltage to the first electrode of the first transistor T1. Accordingly, the bias transistor T8 may provide the bias voltage to the first transistor T1 without adding a line for providing the bias voltage and a line for controlling the bias transistor T8, and an increase in the density of the pixel circuit PC or an increase in the area of the pixel circuit PC may be prevented.

A fifth insulating layer may be disposed between the third conductive layer and the fourth conductive layer. The fifth insulating layer may include at least one inorganic insulating material such as silicon oxide, silicon nitride, silicon oxynitride, or the like and/or an organic insulating material such as polyimide (PI) or the like.

The fifth conductive layer may be disposed on the fourth conductive layer. The fifth conductive layer may include at least one conductive material such as molybdenum (Mo), copper (Cu), aluminum (Al), titanium (Ti), or the like. The fifth conductive layer may include a data line 251, a first power line 252, and a tenth connection electrode 253.

The data line 251 may transmit the data signal DATA. The data line 251 may be electrically connected to the third connection electrode 243. The third connection electrode 243 may electrically connect the first electrode of the second transistor T2 to the data line 251.

The first power line 252 may transmit the voltage of the first power source ELVDD. The first power line 252 may be electrically connected to the sixth connection electrode 246. The fifth connection electrode 245 and the sixth connection electrode 246 may electrically connect the first electrode of the fifth transistor T5 and the second electrode of the storage capacitor CST to the first power line 252.

The tenth connection electrode 253 may be electrically connected to the seventh connection electrode 247. The seventh connection electrode 247 and the tenth connection electrode 253 may electrically connect the second electrode of the sixth transistor T6 and the second electrode of the seventh transistor T7 to the first electrode of the light emitting element OLED.

A sixth insulating layer may be disposed between the fourth conductive layer and the fifth conductive layer. The sixth insulating layer may include at least one inorganic insulating material of silicon oxide, silicon nitride, silicon oxynitride, or the like and/or an organic insulating material such as polyimide (PI) or the like.

Figure 7:
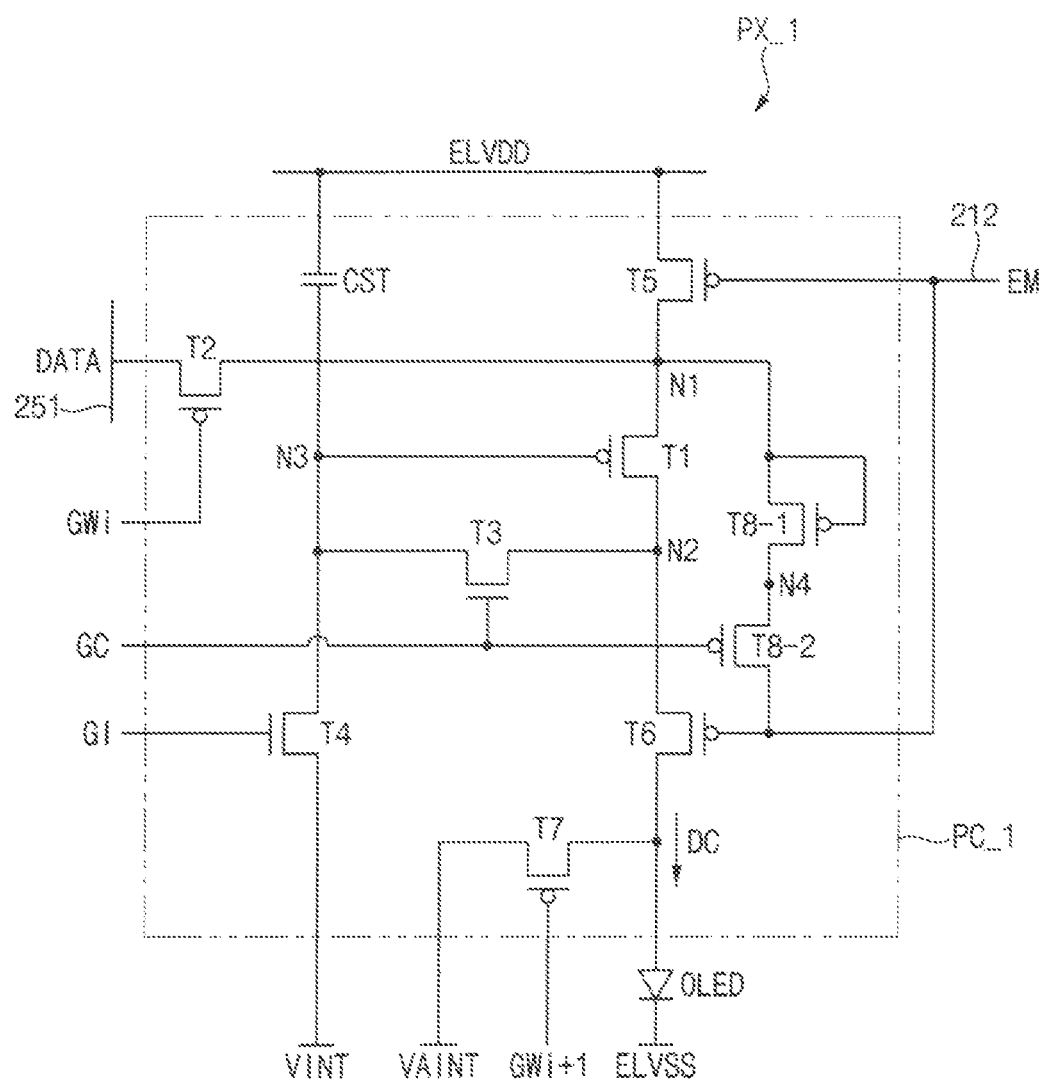
FIG. 7 is a schematic diagram of an equivalent circuit illustrating a pixel according to an embodiment.

FIG. 7 is a schematic diagram of an equivalent circuit illustrating a pixel PX_1 according to an embodiment.

Referring to FIG. 7, the pixel PX_1 may include a light emitting element OLED and a pixel circuit PC_1. The pixel circuit PC_1 may include transistors and a storage capacitor CST. The transistors may include a first transistor T1, a second transistor T2, a third transistor T3, a fourth transistor T4, a fifth transistor T5, a sixth transistor T6, a seventh transistor T7, a first bias transistor T8-1, and a second bias transistor T8-2. Description of components of the pixel PX_1 described with reference to FIG. 7, which is substantially the same as or similar to those of the pixel PX described with reference to FIG. 3, will be omitted.

The first bias transistor T8-1 may be electrically connected between a fourth node N4 and a first node N1. A first electrode of the first bias transistor T8-1 may be electrically connected to a fourth node N4. A second electrode of the first bias transistor T8-1 may be electrically connected to the first node N1. A gate electrode of the first bias transistor T8-1 may be electrically connected to the second electrode of the first bias transistor T8-1. The gate electrode of the first bias transistor T8-1 may be electrically connected to the second electrode of the first bias transistor T8-1, and the first bias transistor T8-1 may be diode-connected.

The second bias transistor T8-2 may be electrically connected between an emission control line 212 providing an emission control signal EM and the fourth node N4. A first electrode of the second bias transistor T8-2 may be electrically connected to the emission control line 212. A second electrode of the second bias transistor T8-2 may be electrically connected to the fourth node N4. A gate electrode of the second bias transistor T8-2 may receive a compensation gate signal GC.

The first bias transistor T8-1 and the second bias transistor T8-2 may transmit the emission control signal EM to the first node N1 in response to the emission control signal EM and the compensation gate signal GC. For example, the first bias transistor T8-1 and the second bias transistor T8-2 may be turned-on to transmit the emission control signal EM to the first node N1 in case that the supply of the compensation gate signal GC is stopped and the emission control signal EM is provided. A logic high voltage (e.g., about 10 V) of the emission control signal EM may be greater than a voltage (e.g., about 3 V to about 5 V) of a data signal DATA applied to the first node N1 by the second transistor T2. Thus, the first bias transistor T8-1 and the second bias transistor T8-2 may be turned-on to transmit the logic high voltage of the emission control signal EM to the first node N1 in case that a logic low voltage of the compensation gate signal GC is applied and the logic high voltage of the emission control signal EM is applied through the emission control line 212.

In case that the emission control signal EM is transmitted to the first node N1, the emission control signal EM may be applied as a bias voltage to the first electrode of the first transistor T1, and the first transistor T1 may be on-biased. The first transistor T1 may be on-biased by the emission control signal EM, and hysteresis of the first transistor T1 may be compensated.

Figure 8:
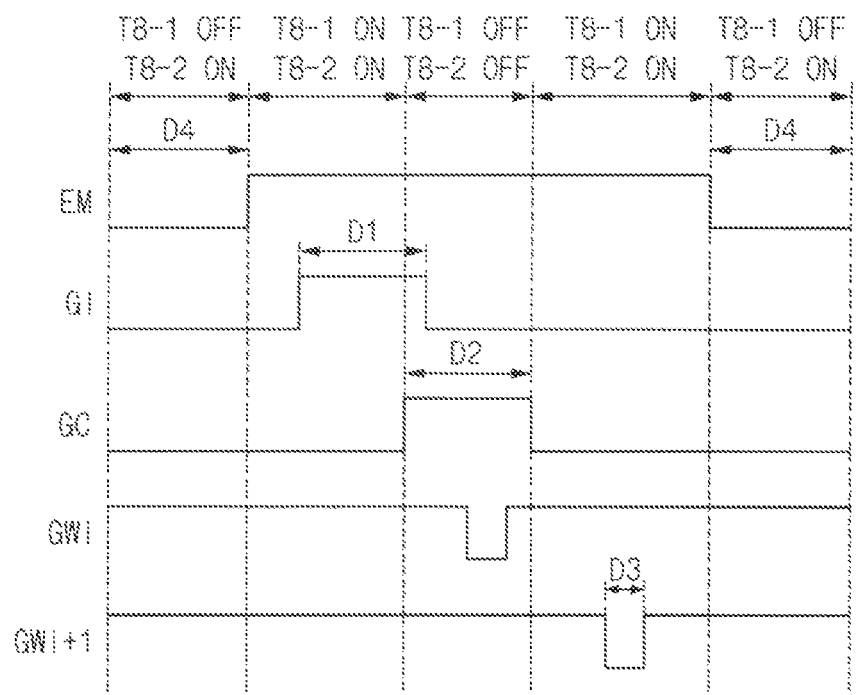
FIGS. 8 and 9 are schematic diagrams for describing a method of driving the pixel in FIG. 7.
Figure 9:
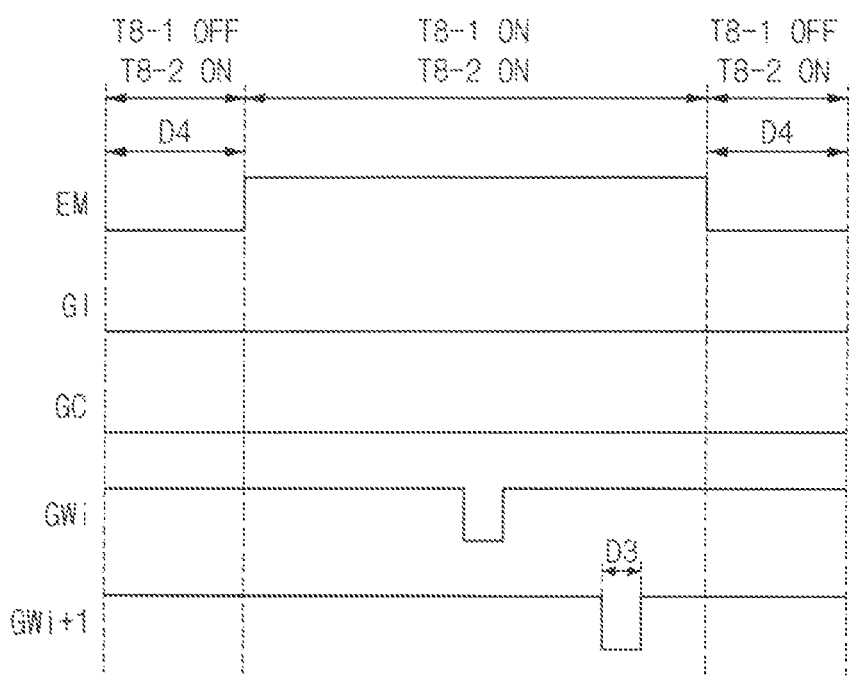

FIGS. 8 and 9 are schematic diagrams for describing a method of driving the pixel PX_1 in FIG. 7. Description of components of the driving method of the pixel PX_1 described with reference to FIGS. 7 to 9, which are substantially the same as or similar to those of the driving method of the pixel PX described with reference to FIGS. 3 to 5, will be omitted.

Referring to FIGS. 7 and 8, the pixel PX_1 may receive signals for displaying an image during a display scan period DS (e.g., refer to FIG. 2).

First, the emission control signal EM may be applied to the pixel PX_1. In case that the emission control signal EM is applied, the first bias transistor T8-1 and the second bias transistor T8-2 may be turned-on. In case that the first bias transistor T8-1 and the second bias transistor T8-2 are turned-on, the logic high voltage of the emission control signal EM may be provided to the first node N1. Accordingly, the logic high voltage of the emission control signal EM, which is a relatively high voltage, may be applied to the first electrode of the first transistor T1, and the first transistor T1 may be on-biased while the first bias transistor T8-1 and the second bias transistor T8-2 are turned-on.

The initialization gate signal GI may be applied to the pixel PX_1 in the initialization period D1.

The compensation gate signal GC, the write gate signal GWi, and the data signal DATA may be applied to the pixel PX_1 in the writing and compensation period D2. In case that the compensation gate signal GC is applied, the second bias transistor T8-2 may be turned-off, and accordingly, the first bias transistor T8-1 may be turned-off. Accordingly, a period in which the first bias transistor T8-1 and the second bias transistor T8-2 are turned-on may not overlap a period in which the second transistor T2 and the third transistor T3 are turned-on.

In case that the data signal DATA and the emission control signal EM are both applied to the first node N1 in the writing and compensation period D2, a voltage corresponding to the combination of the data signal DATA and the emission control signal EM may be stored in the gate electrode of the first transistor T1, and accordingly, the range of the driving current DC may increase. In case that the range of the driving current DC increases, the pixel PX_1 may display colors more precisely, however, power consumption of the pixel PX_1 may increase. In the embodiment, the data signal DATA may be applied to the first node N1 and the emission control signal EM may not be applied to the first node N1 in the writing and compensation period D2, so that power consumption of the pixel PX_1 may not increase.

The bypass gate signal GWi+1 may be applied to the pixel PX_1 in a bypass period D3.

The supply of the emission control signal EM to the pixel PX_1 may be stopped in the emission period D4. In case that the supply of the emission control signal EM is stopped, the first bias transistor T8-1 may be turned-off.

Referring to FIGS. 7 and 9, the pixel PX_1 may receive signals for maintaining the luminance of the image output in the display scan period DS (e.g., refer to FIG. 2) during a self-scan period SS (e.g., refer to FIG. 2).

First, the emission control signal EM may be applied to the pixel PX_1. In case that the emission control signal EM is applied, the first bias transistor T8-1 and the second bias transistor T8-2 may be turned-on. In case that the first bias transistor T8-1 and the second bias transistor T8-2 are turned-on, the logic high voltage of the emission control signal EM may be provided to the first node N1. Accordingly, the first transistor T1 may be on-biased while the first bias transistor T8-1 and the second bias transistor T8-2 are turned-on.

The bypass gate signal GWi+1 may be applied to the pixel PX_1 in the bypass period D3.

The supply of the emission control signal EM to the pixel PX_1 may be stopped in an emission period D4. In case that the supply of the emission control signal EM is stopped, the first bias transistor T8-1 may be turned-off.

Figure 10:
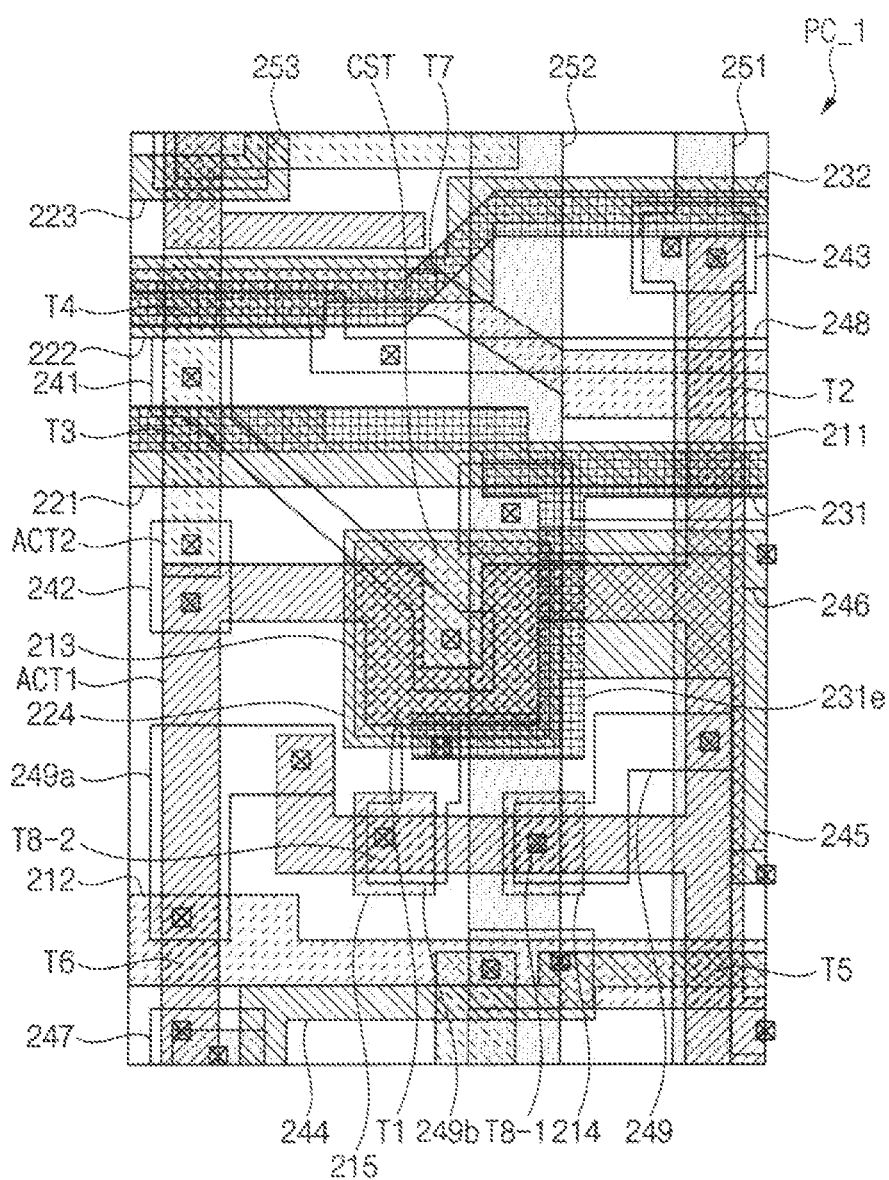
FIG. 10 is a schematic layout diagram illustrating a pixel circuit included in the pixel in FIG. 7.

FIG. 10 is a schematic layout diagram illustrating the pixel circuit PC_1 included in the pixel PX_1 in FIG. 7.

Referring to FIG. 10, the pixel circuit PC_1 may include a first active layer ACT1, a first conductive layer, a second conductive layer, a second active layer ACT2, a third conductive layer, a fourth conductive layer, and a fifth conductive layer. The pixel circuit PC_1 described with reference to FIG. 10 may be substantially the same as or similar to the pixel circuit PC described with reference to FIG. 6 except for the first conductive layer, the third conductive layer, and the fourth conductive layer. Accordingly, detailed description of the described components will be omitted.

The first active layer ACT1 may be disposed on a substrate. The first transistor T1, the second transistor T2, the fifth transistor T5, the sixth transistor T6, the seventh transistor T7, the first bias transistor T8-1, and the second bias transistor T8-2 may be formed along the first active layer ACT1.

The first conductive layer may include a write gate line 211, an emission control line 212, a first gate pattern 213, a second gate pattern 214, and a third gate pattern 215.

A portion of the second gate pattern 214 overlapping the first active layer ACT1 may be the gate electrode of the first bias transistor T8-1. A portion of the third gate pattern 215 overlapping the first active layer ACT1 may be the gate electrode of the second bias transistor T8-2.

The third conductive layer may include a second compensation gate line 231 and a second initialization gate line 232. The second compensation gate line 231 may include an extension portion 231e protruding in a direction in a plan view.

The fourth conductive layer may include a first connection electrode 241, a second connection electrode 242, a third connection electrode 243, a fourth connection electrode 244, a fifth connection electrode 245, a sixth connection electrode 246, a seventh connection electrode 247, a second initialization voltage line 248, an eighth connection electrode 249, a ninth connection electrode 249a, and an eleventh connection electrode 249b.

The eighth connection electrode 249 may electrically connect the first active layer ACT1 and the second gate pattern 214. The eighth connection electrode 249 may electrically connect the gate electrode of the first bias transistor T8-1 to the second electrode of the first bias transistor T8-1.

The ninth connection electrode 249a may electrically connect the first active layer ACT1 and the emission control line 212. The ninth connection electrode 249a may electrically connect the first electrode of the second bias transistor T8-2 to the emission control line 212.

The eleventh connection electrode 249b may electrically connect the third gate pattern 215 and the extension portion 231e of the second compensation gate line 231. The eleventh connection electrode 249b may electrically connect the gate electrode of the second bias transistor T8-2 to the second compensation gate line 231.

The first bias transistor T8-1 may be diode-connected by the eighth connection electrode 249. The first electrode of the second bias transistor T8-2 may be electrically connected to the emission control line 212 by the ninth connection electrode 249a. The gate electrode of the second bias transistor T8-2 may be electrically connected to the second compensation gate line 231 by the eleventh connection electrode 249b, so that the first bias transistor T8-1 and the second bias transistor T8-2 may provide the emission control signal EM transmitted by the emission control line 212 as a bias voltage to the first electrode of the first transistor T1. Accordingly, the first bias transistor T8-1 and the second bias transistor T8-2 may provide the bias voltage to the first transistor T1 without adding a line for providing the bias voltage and a line for controlling the first bias transistor T8-1 and the second bias transistor T8-2, and an increase in the density of the pixel circuit PC_1 or an increase in the area of the pixel circuit PC_1 may be prevented.

The pixel and the display device according to the embodiments may be applied to a display device included in a computer, a notebook, a mobile phone, a smart phone, a smart pad, a PMP, a PDA, an MP3 player, or the like.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A pixel comprising:
a light emitting element;
a first transistor electrically connected between a first node and a second node, the first transistor controlling a driving current provided to the light emitting element based on a voltage of a third node;
a second transistor electrically connected between a data line providing a data signal and the first node, the second transistor being turned-on in response to a write gate signal;
a third transistor electrically connected between the second node and the third node, the third transistor being turned-on in response to a compensation gate signal; and
a bias transistor electrically connected between an emission control line providing an emission control signal and the first node, the bias transistor including a gate electrode electrically connected to the first node.

2. The pixel of claim 1, wherein the bias transistor applies the emission control signal to the first node in response to the emission control signal.

3. The pixel of claim 1, wherein
the third transistor is turned-on at a first frequency, and
the bias transistor is turned-on at a second frequency greater than the first frequency.

4. The pixel of claim 3, wherein the first frequency is equal to an image refresh rate and corresponds to a divisor of the second frequency.

5. The pixel of claim 4, further comprising:
a fourth transistor electrically connected between a first initialization power source and the third node, the fourth transistor being turned-on in response to an initialization gate signal;
a fifth transistor electrically connected between a first power source and the first node, the fifth transistor being turned-off in response to the emission control signal;
a sixth transistor electrically connected between the second node and a first electrode of the light emitting element, the sixth transistor being turned-off in response to the emission control signal;
a seventh transistor electrically connected between a second initialization power source and the first electrode of the light emitting element, the seventh transistor being turned-on in response to a bypass gate signal; and
a storage capacitor electrically connected between the third node and the first power source.

6. The pixel of claim 5, wherein
the fourth transistor is turned-on at the first frequency, and
the fifth transistor and the sixth transistor are turned-off at the second frequency.

7. The pixel of claim 1, wherein
each of the first transistor, the second transistor, and the bias transistor is a P-type transistor, and
the third transistor is an N-type oxide semiconductor transistor.

8. A pixel comprising:
a light emitting element;
a first transistor electrically connected between a first node and a second node, the first transistor controlling a driving current provided to the light emitting element based on a voltage of a third node;
a second transistor electrically connected between a data line providing a data signal and the first node, the second transistor being turned-on in response to a write gate signal;
a third transistor electrically connected between the second node and the third node, the third transistor being turned-on in response to a compensation gate signal;
a first bias transistor electrically connected between a fourth node and the first node, the first bias transistor including a gate electrode electrically connected to the first node; and
a second bias transistor electrically connected between an emission control line providing an emission control signal and the fourth node, the second bias transistor being turned-off in response to the compensation gate signal.

9. The pixel of claim 8, wherein the first bias transistor and the second bias transistor apply the emission control signal to the first node in response to the emission control signal and the compensation gate signal.

10. The pixel of claim 8, wherein a period in which the first bias transistor and the second bias transistor are turned-on does not overlap a period in which the second transistor is turned-on.

11. The pixel of claim 8, further comprising:
a fourth transistor electrically connected between a first initialization power source and the third node, the fourth transistor being turned-on in response to an initialization gate signal;
a fifth transistor electrically connected between a first power source and the first node, the fifth transistor being turned-off in response to the emission control signal;
a sixth transistor electrically connected between the second node and a first electrode of the light emitting element, the sixth transistor being turned-off in response to the emission control signal;
a seventh transistor electrically connected between a second initialization power source and the first electrode of the light emitting element, the seventh transistor being turned-on in response to a bypass gate signal; and
a storage capacitor electrically connected between the third node and the first power source.

12. The pixel of claim 11, wherein
the third transistor and the fourth transistor are turned-on at a first frequency, and
the fifth transistor and the sixth transistor are turned-off at a second frequency greater than the first frequency.

13. The pixel of claim 12, wherein the first frequency is equal to an image refresh rate and corresponds to a divisor of the second frequency.

14. The pixel of claim 8, wherein
each of the first transistor, the second transistor, the first bias transistor, and the second bias transistor is a P-type transistor, and
the third transistor is an N-type oxide semiconductor transistor.

15. A display device comprising:
a pixel;
a gate driver that provides a compensation gate signal at a first frequency and a write gate signal to the pixel;
an emission driver that provides an emission control signal at a second frequency greater than the first frequency to the pixel; and a data driver that provides a data signal to the pixel based on the first frequency, wherein the pixel includes:
- a light emitting element;
- a first transistor electrically connected between a first node and a second node, the first transistor controlling a driving current provided to the light emitting element based on a voltage of a third node;
- a second transistor electrically connected between a data line providing the data signal and the first node, the second transistor being turned-on in response to the write gate signal;
- a third transistor electrically connected between the second node and the third node, the third transistor being turned-on in response to the compensation gate signal; and
- a bias transistor electrically connected between an emission control line providing the emission control signal and the first node, the bias transistor including a gate electrode electrically connected to the first node.

16. The display device of claim 15, wherein
the gate driver provides the compensation gate signal in a display scan period within a frame period and does not provide the compensation gate signal in a self-scan period within the frame period, and
the emission driver provides the emission control signal in the display scan period and the self-scan period.

17. The display device of claim 16, wherein
the gate driver further provides an initialization gate signal at the first frequency and a bypass gate signal to the pixel, and the pixel further includes:
- a fourth transistor electrically connected between a first initialization power source and the third node, the fourth transistor being turned-on in response to the initialization gate signal;
- a fifth transistor electrically connected between a first power source and the first node, the fifth transistor being turned-off in response to the emission control signal;
- a sixth transistor electrically connected between the second node and a first electrode of the light emitting element, the sixth transistor being turned-off in response to the emission control signal;
- a seventh transistor electrically connected between a second initialization power source and the first electrode of the light emitting element, the seventh transistor being turned-on in response to the bypass gate signal; and
- a storage capacitor electrically connected between the third node and the first power source.

18. The display device of claim 17, wherein the gate driver provides the initialization gate signal in the display scan period and not to provide the initialization gate signal in the self-scan period.

19. The display device of claim 16, wherein the first frequency is equal to an image refresh rate and corresponds to a divisor of the second frequency.

20. The display device of claim 19, wherein a number of the self-scan period included in the frame period increases in case that the first frequency decreases.

* * * * *